(12) United States Patent
Mizugaki et al.

(10) Patent No.: US 6,925,023 B2
(45) Date of Patent: Aug. 2, 2005

(54) SEMICONDUCTOR MEMORY DEVICE AND ELECTRONIC DEVICE

(75) Inventors: Koichi Mizugaki, Suwa (JP); Eitaro Otsuka, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/836,227

(22) Filed: May 3, 2004

(65) Prior Publication Data

US 2005/0002256 A1 Jan. 6, 2005

(30) Foreign Application Priority Data

May 15, 2003 (JP) ........................................ 2003-137281

(51) Int. Cl.[7] ................................................ G11C 7/00
(52) U.S. Cl. ...................................... 365/222; 365/149
(58) Field of Search ............................ 365/222, 189.01, 365/149

(56) References Cited

U.S. PATENT DOCUMENTS

| | | | | |
|---|---|---|---|---|
| 4,984,208 A | * | 1/1991 | Sawada et al. | ............. 365/222 |
| 5,323,352 A | * | 6/1994 | Miyata et al. | ............. 365/222 |
| 6,463,002 B2 | | 10/2002 | Kim et al. | |
| 6,597,615 B2 | | 7/2003 | Mizugaki | |
| 6,834,020 B2 | | 12/2004 | Takahashi et al. | |
| 2002/0001247 A1 | | 1/2002 | Kim et al. | |
| 2003/0063512 A1 | | 4/2003 | Takahashi et al. | |

FOREIGN PATENT DOCUMENTS

| | | |
|---|---|---|
| JP | A 2001-357671 | 12/2001 |
| JP | A 2002-25252 | 1/2002 |
| JP | A 2002-74945 | 3/2002 |

* cited by examiner

*Primary Examiner*—Vu A. Le
(74) *Attorney, Agent, or Firm*—Oliff & Berridge, PLC

(57) ABSTRACT

In the semiconductor memory device of the invention, while a write enable signal supplied from an external device is at an active level representing a data writing request, an access control module prohibits start of any of a read access operation, a write access operation, and a refresh operation, even in the case of generation of any one of a read access request, a write access request, and a refresh request. Even in the case of generation of a write access request or a refresh request in advance, the access control module preferentially executes a read access operation in response to a read access request generated by a change of an external access timing signal to an inactive level while the write enable signal is at an inactive level. This arrangement desirably eliminates the long rate restriction of the semiconductor memory device.

11 Claims, 11 Drawing Sheets

| | #CS | Refresh Mode (see Notes) |
|---|---|---|
| Operation | L | Mode 1 |
| Standby | H | Mode 2 |

(Notes)

Refresh Mode 1: A refresh operation is executed in the case of no execution of either a read access or a write access after generation of a refresh timing signal inside a memory chip.

Refresh Mode 2: A refresh operation is executed in response to generation of a refresh timing signal inside a memory chip.

SEMICONDUCTOR MEMORY DEVICE AND ELECTRONIC DEVICE

BACKGROUND OF THE INVENTION

1. Field of the Invention

The present invention relates to activation control of word lines in a semiconductor memory device having a memory array, in which dynamic memory cells are arranged in a matrix.

2. Description of the Related Art

Typically used semiconductor memory devices are DRAMs and SRAMs. As is well known in the art, the DRAM is more moderately priced and has the larger capacity than the SRAM but requires refresh operations. The SRAM does not conveniently require refresh operations, but is more expensive and has the smaller capacity than the DRAM.

A known virtual SRAM (VSRAM: Virtually Static RAM) has been developed as the semiconductor memory device having the advantages of both the DRAM and the SRAM. The virtual SRAM (also called pseudo SRAM (PSRAM: Pseudo Static RAM)) has a memory cell array of dynamic memory cells like the DRAM and a built-in refresh timer to internally execute refresh operations. An external device (for example, a CPU) connecting with the virtual SRAM can thus gain access to the virtual SRAM to write and read data without specifically noticing refresh operations. This characteristic of the virtual SRAM is called 'permeability of refresh operations'.

The prior art virtual SRAM executes the refresh operation according to its working state. For example, in a working state where an external access is executed (hereafter referred to as 'operation mode'), the virtual SRAM specifies a refresh execution timing to execute a refresh operation, in response to an external access timing signal representing the timing of an external access after generation of a refresh timing signal that is output at preset intervals by the refresh timer. In another working state where no external access is executed (hereafter referred to as 'standby mode'), the virtual SRAM specifies the refresh execution timing to execute the refresh operation, in response to generation of the refresh timing signal.

The cycle time (refresh cycle time) of the generation cycle (refresh cycle) of the refresh timing signal may be set as discussed below. The prior art virtual SRAM is designed to refresh memory cells in units of rows. When the refresh cycle time is Trc and the number of rows included in the memory cell array is m (where m is an integer of not less than 1), a total refresh time Tsum required for refreshing all the memory cells is equal to the m-fold of the refresh cycle time Trc (m·Trc). The refresh operation of one memory cell is executed at every refresh time Tsum. The value of the refresh cycle time Trc is thus set to ensure storage of data, while each memory cell is refreshed at every refresh time Tsum.

The refresh operation in the virtual SRAM is, for example, disclosed in Japanese Patent Laid-Open Gazette No. 2002-74945.

The prior art virtual SRAM generates the external access timing signal, in response to a variation of an externally input address. No variation of the external address leads to non-generation of the external access timing signal, even in the case of generation of the refresh timing signal. In this case, the refresh execution timing is not specified and the refresh operation is delayed.

The delayed refresh operation extends the refresh time Tsum and thereby lengthens the interval of the refresh operation of each memory cell. This undesirably increases the possibility of losing data. As the countermeasure against this problem, the prior art virtual SRAM generally imposes the restriction of 'prohibiting a continuous access to an identical address for or over a preset time period' (referred to as 'long rate restriction' or 'long cycle restriction'.

The SRAM does not have this long rate restriction. The prior art virtual SRAM is thus required to improve the permeability of the refresh operation and to eliminate the long rate restriction.

SUMMARY OF THE INVENTION

The object of the invention is thus to provide a technique of eliminating the long rate restriction of a semiconductor memory device like a virtual SRAM.

In order to attain at least part of the above and the other related objects, the present invention is directed to a semiconductor memory device having a memory cell array in which dynamic memory cells are arranged in a matrix. The semiconductor memory device includes: an external access timing signal generation module that generates a pulse signal, which changes to an active level in response to a variation of an external address supplied from an external device, as an external access timing signal representing a reference timing of an access operation requested from the external device; a refresh timer that generates a refresh timing signal representing a reference timing of a refresh operation of the memory cell array; and an access control module that controls execution of a read access, a write access, and a refresh operation of the memory cell array. While a write enable signal supplied from the external device is at an active level representing a data writing request, the access control module prohibits start of any of a read access operation, a write access operation, and a refresh operation, even in the case of generation of any one of a read access request, a write access request, and a refresh request. Even in the case of generation of a write access request or a refresh request in advance, the access control module preferentially executes a read access operation in response to a read access request generated by a change of the external access timing signal to an inactive level while the write enable signal is at an inactive level.

The semiconductor memory device of the invention prohibits start of any of a read access operation, a write access operation, and a refresh operation, while the external access timing signal is at the active level. The semiconductor memory device of the invention preferentially executes a read access operation in response to a read access request generated by a change of the external access timing signal to the inactive level, even when a write access request or a refresh request has been generated in advance and has not yet been executed. This arrangement desirably shortens the time elapsing before start of a read access, compared with the arrangement of not giving preference to the read access. This enhances the access rate in the read access. This arrangement also shortens the time elapsing before start of a read access, compared with the arrangement of starting one of a read access operation, a write access operation, and a refresh operation while the external access timing signal is at the active level. This enhances the access rate in the read access.

In one preferable embodiment of the semiconductor memory device of the invention, in the case of execution of any of a read access operation, a write access operation, and a refresh operation at the return timing of the write enable signal to the inactive level, the access control module triggers execution of a write access operation for a preset time period after completion of the executed operation.

This desirably prevents interruption of the operation under execution.

In one preferable embodiment of the invention, the semiconductor memory device further includes a storage module that stores the external address and external data at the return timing of the write enable signal to the inactive level. A write access operation is executed with the external address and the external data stored in the storage module.

This arrangement facilitates execution of a write access operation with the external address and the external data stored in the storage module.

The technique of the invention is not restricted to the semiconductor memory device but is also actualized by a write control method of such a semiconductor memory device and an electronic device including such a semiconductor memory device.

These and other objects, features, aspects, and advantages of the present invention will become more apparent from the following detailed description of the preferred embodiment with the accompanying drawings.

DESCRIPTION OF THE PREFERRED EMBODIMENTS

Figures 1, 2:
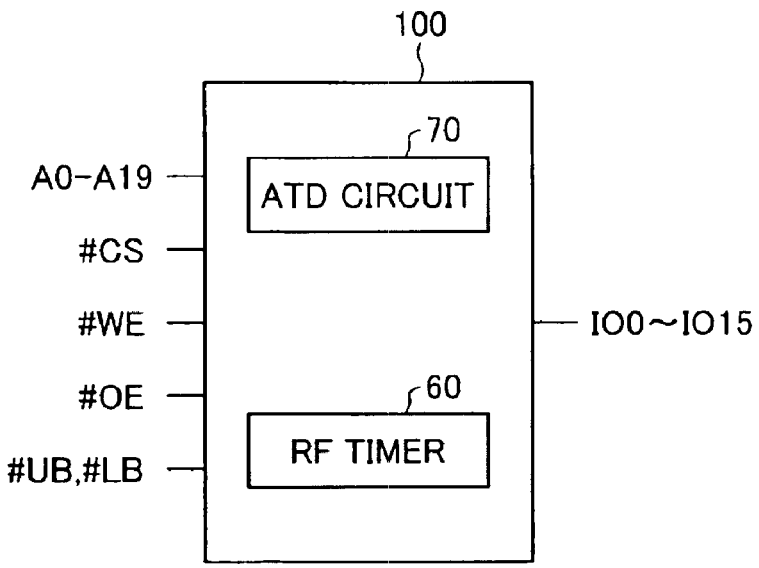
FIG. 1 shows the terminal structure of a memory chip in one embodiment of the semiconductor memory device of the invention.
FIG. 2 shows divisions of working state of the memory chip corresponding to the signal level of a chip select signal #CS.

One mode of carrying out the invention is discussed below as a preferred embodiment in the following sequence:

A. Terminal Structure of Semiconductor Memory Device and Outline of Working State
B. Internal Structure of Semiconductor Memory Device
  B1. General Structure
  B2. Row Control Circuit
  B.2.1 Read Execution Signal Generator
  B.2.2 Write Execution Signal Generator
  B.2.3 Refresh Execution Signal Generator
  B.2.4 Operations of Respective Generators
  B3. Address Buffer and Data Input Buffer
  B.3.1 Address Buffer
  B.3.2 Data Input Buffer
C. Operations in Operation Mode
  C1. Read Access
  C2. Early Write Access
  C3. Delay Write Access
D. Application to Electronic Device
A. Terminal Structure of Semiconductor Memory Device and Outline of Working State FIG. 1 shows the terminal structure of a memory chip 100 in one embodiment of the semiconductor memory device of the invention. The memory chip 100 has terminals given below:

A0 to A19: 20 Address Input Terminals
CS: Chip Select Input Terminal
WE: Write Enable Input Terminal
OE: Output Enable Input Terminal
LB: Lower Byte Enable Input Terminal
UB: Upper Byte Enable Input Terminal
IO0 to IO15: 16 Input-Output Data Terminals In the description below, an identical code is allocated to the name of a terminal and the name of its corresponding signal. The mark '#' given as the prefix of the terminal name (signal name) represents a negative logic. Although there are multiple address input terminals A0 to A19 and multiple input-output data terminals IO1 to IO15, they are simplified in FIG. 1. A power terminal and other terminals that are not required for the following description are omitted from the illustration.

The memory chip 100 is constructed as a virtual SRAM (VSRAM) that gains access according to the same procedure as that of a general asynchronous SRAM. Unlike the SRAM, however, the VSRAM has a dynamic memory cell and thereby requires refresh in a predetermined period. The memory chip 100 accordingly has a built-in refresh timer 60. In the specification hereof, the operation of reading or writing data from or into an external device (control device) is called 'external access' or 'access', and the refresh operation by a built-in refresh controller is called 'internal refresh' or 'refresh'. The refresh may be abbreviated as 'RF'.

The memory chip 100 includes an address transition detection circuit 70 to detect a variation of at least one bit of an input address A0 to A19. The circuits in the memory chip 100 work, in response to an address transition detection signal supplied from the address transition detection circuit 70. The address transition detection signal corresponds to the external access timing signal of the invention. In the description below, the address transition detection circuit 70 may be referred to as 'ATD circuit', and the address transition detection signal ATD (external access timing signal) may be referred to as 'ATD signal'.

A chip select signal #CS shown in FIG. 1 is used to control the working state of the memory chip 100. FIG. 2 shows divisions of the working state of the memory chip 100 corresponding to the signal level of the chip select signal #CS. In the specification hereof, the 'level H' and the 'level L' respectively denote 'level 1' and 'level 0' of the two levels of a binary signal.

When the chip select signal #CS is at the level L (active), the internal working state of the memory chip 100 is an operation mode, in which a read/write operation cycle (hereafter may also be referred to as 'operation cycle' or 'read/write cycle') is carried out. In the operation cycle, execution of an external access is allowed, while an internal refresh operation is executed at an appropriate timing.

When the chip select signal #CS is at the level H, on the other hand, the internal working state of the memory chip 100 is a standby mode. In the standby mode, execution of an external access is prohibited to make all the word lines inactive. During execution of an internal refresh operation, however, only a word line specified by a refresh address is activated.

The refresh operation is carried out according to a first refresh mode in the operation mode and is executed according to a second refresh mode in the standby mode. In the first refresh mode, a refresh operation starts while neither a read access nor a write access is executed after generation of a refresh timing signal from the refresh timer 60. In the second refresh mode, on the other hand, a refresh operation starts immediately after generation of the refresh timing signal from the refresh timer 60. In this manner, the memory chip 100 is refreshed in the adequate refresh mode corresponding to one of the two working states.

The address A0 to A19 shown in FIG. 1 is 20-bit data and specifies a 1 mega-word address. The input-output data IO0 to IO15 is 16-bit data corresponding to 1 word. Namely each value of the address A0 to A19 corresponds to 16 bits (1 word) and simultaneously inputs or outputs 16-bit input-output data IO0 to IO15.

The operation cycle is regarded as a write cycle when a write enable signal #WE is at the level L, while being regarded as a read cycle when the write enable signal #WE is at the level H. An output enable signal #OE at the level L enables output from the input-output data terminals IO0 to IO15. A lower byte enable signal #LB and an upper byte enable signal #UB are control signals for reading and writing lower bytes and upper bytes of 1 word (16 bits).

FIGS. 3(a) through 3(g) are a timing chart showing the outline of the operations of the memory chip 100. The working state is selected out of the two modes, the operation mode and the standby mode, in response to the level change of the chip select signal #CS.

Figure 3:
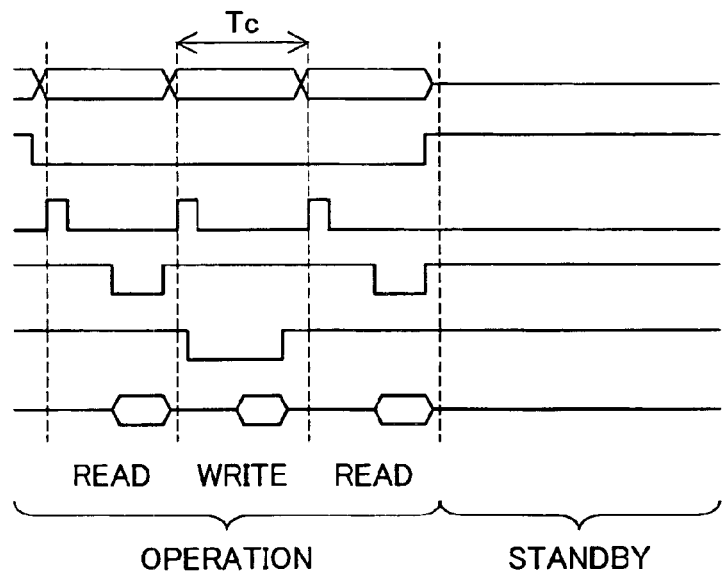
FIGS. 3(a) through 3(g) are a timing chart showing the outline of the operations of the memory chip.

During first three cycles in FIG. 3, the chip select signal #CS is at the level L. The selected working state is thus the operation mode, in which the operation cycle is executed. In the operation cycle, either reading (read cycle) or writing (write cycle) is carried out according to the level of the write enable signal #WE. Output from the input-output data terminals IO0 to IO15 is allowed according to the level of the output enable signal #OE, that is, at the level L.

A shortest period Tc of the ATD signal (that is, a shortest period of the variation of the address A0 to A19) corresponds to a cycle time (cycle period) of this memory chip 100. The cycle time Tc is set, for example, in a range of about 50 ns to about 100 ns in the case of a random access.

On conclusion of the third cycle in FIG. 3, the chip select signal #CS rises to the level H. The working status is thus changed to the standby mode.

B. Internal Structure of Semiconductor Memory Device

B1. General Structure

Figure 4:
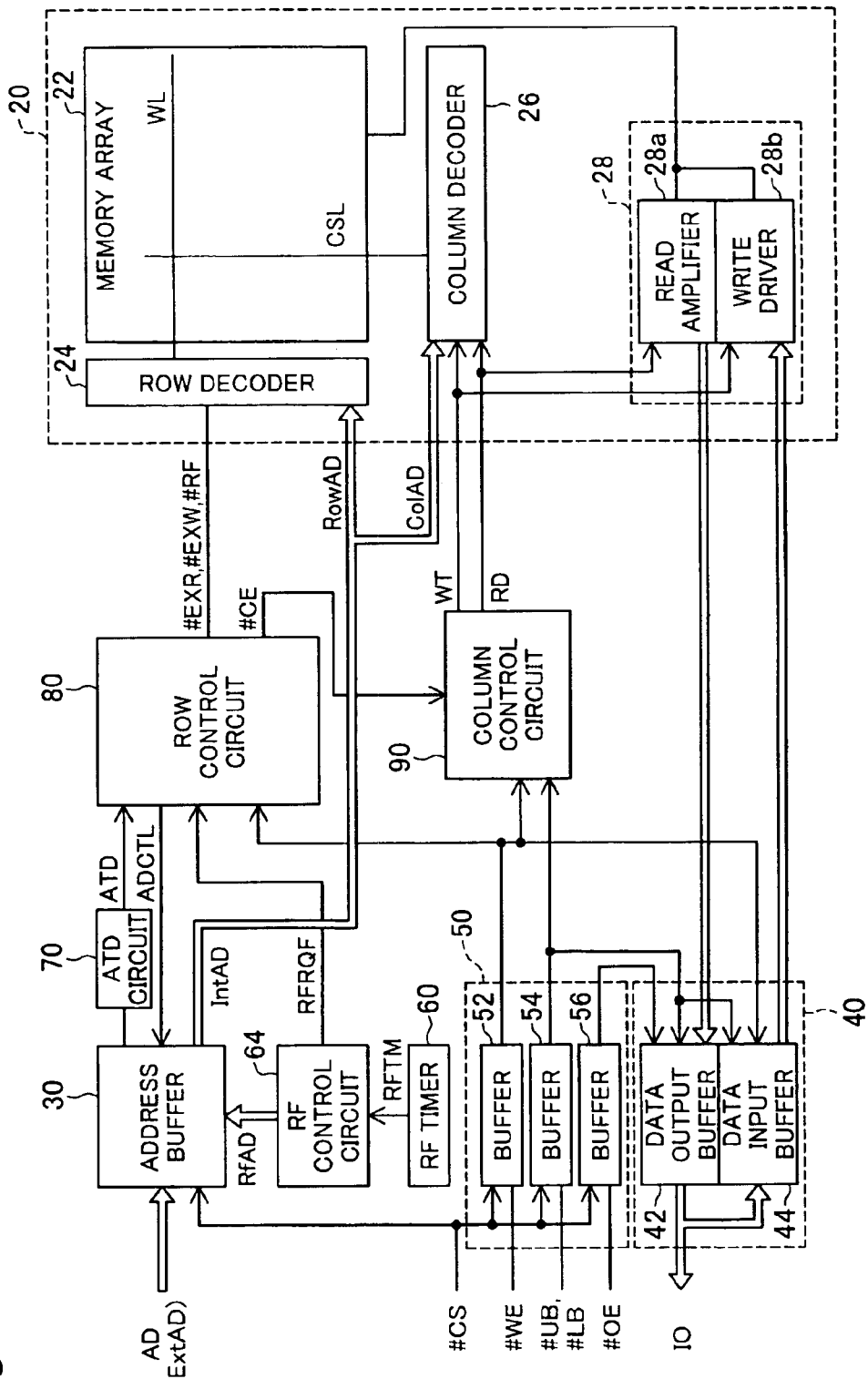
FIG. 4 is a block diagram showing the internal structure of the memory chip.

FIG. 4 is a block diagram showing the internal structure of the memory chip 100. The memory chip 100 includes a memory block 20, an address buffer 30, and a data input-output block 40.

The memory block 20 has a memory cell array 22, a row decoder 24, a column decoder 26, and a gate block 28. The structure of the memory cell array 22 is identical with that of a typical DRAM memory cell array. Namely the memory cell array 22 has plurality of 1-transistor 1-capacitor-type memory cells arranged in a matrix. A word line WL and a bit line pair CSL (data line pair) are connected to each memory cell. In this embodiment, the memory cell array 22 has 4096 lines in the row direction and 256×16 lines (4096 lines) in the column direction and includes memory cells of 1 mega word (16 mega bits) arranged in a matrix. The row decoder 24 includes a row driver and selects and activates one of 4096 word lines in the memory cell array 22 according to a 12-bit row address RowAD (A8 to A19) of an internal address IntAD (A0 to A19) supplied from the address buffer 30. The column decoder 26 includes a column driver and simultaneously selects bit line pairs of 1 word (16 bits) among 256×16 bit line pairs in the memory cell array 22 according to an 8-bit column address ColAD (A0 to A7) of the internal address IntAD supplied from the address buffer 30. The gate block 28 includes a read amplifier 28a and a write driver 28b and ensures data transmission between the data input-output block 40 and the memory array 22. A pre-charge circuit and a sense amplifier (not shown) are also included in the memory block 20.

The address buffer 30 functions to supply an address AD (A0 to A19, also referred to as 'external address ExtAD'), which is given by an external device), or a refresh address RfAD (RA8 to RA19), which is given by a refresh control circuit 64 (discussed later), to another internal circuit. Either the external address ExtAD or the refresh address READ is selected, in response to an address control signal ADCTL sent from a row control circuit 80 (discussed later).

In the case of execution of an external access, memory cells of 1 word (16 bits) are selected by the 12-bit row address RowAD (A8 to A19) and the 8-bit column address ColAD (A0 to A7). Data of 1 word corresponding to the selected memory cells are read out via the read amplifier 28a of the gate block 28 and a data output buffer 42 of the data input-output block 40 or written in via a data input buffer 44 of the data input-output block 40 and the write driver 28b of the gate block 28. In the case of execution of a refresh operation, a word line selected by the 12-bit refresh address RfAD (RA8 to RA19) is activated, and memory cells connecting with the activated word line are refreshed. The details of the address buffer 30 will be discussed later.

The memory chip 100 further includes a buffer block 50, the refresh timer 60, the refresh control circuit 64, the ATD (address transition detection) circuit 70, the row control circuit 80, and a column control circuit 90.

The buffer block 50 has a buffer 52 that receives input of the write enable signal #WE, a buffer 54 that receives input of the lower byte enable signal #LB and the upper byte enable signal #UB, and a buffer 56 that receives input of the output enable signal #OE. The chip select signal #CS is input into each of the buffers 52, 54, and 56 to mask supply of each corresponding signal to the internal circuit. In the description below, output signals from the respective buffers 52, 54, and 56 have identical names with those of the corresponding input signals.

The refresh timer 60 is constructed, for example, by a ring oscillator. The refresh time is set equal to, for example, about 32 μs.

The refresh control circuit 64 generates a timing signal, which represents a timing of a refresh request, in response to a refresh time signal RFTM supplied from the refresh timer 60, and supplies the generated timing signal as a refresh timing signal RFRQF to the row control circuit 80. The refresh control circuit 64 also generates the 12-bit refresh address RFAD (RA8 to RA19) in response to the refresh timing signal RFRQF, and supplies the refresh address RFAD to the address buffer 30. The value of the refresh address RFAD is incremented by one, in response to generation of a refresh request or more specifically when the refresh timing signal RFRQF is changed from the inactive level to the active level. The refresh address READ may be generated by a 12-bit counter.

The ATD circuit 70 detects any variation of the 20-bit address A0 to A19 supplied from the external device and, in response to detection of any variation, generates a pulse of the ATD signal as shown in FIG. 3(*a*).

The row control circuit 80 outputs a read execution signal #EXR, a write execution signal #EXW, a refresh execution signal #RF, and a column enable signal #CE to control the external access and the refresh operation. More specifically the row control circuit 80 sets the signal levels of the read execution signal #EXR, the write execution signal #EXW, the refresh execution signal #RF, and the column enable signal #CE to control activation of a word line by the row decoder 24 and to control selection of bit line pairs by the column decoder 26 via the column control circuit 90. The row control circuit 80 works in response to the ATD signal, the refresh timing signal RFRQF, and the write enable signal #WE. The row control circuit 80 will be discussed more in detail later.

The column control circuit 90 outputs a read gate signal RD and a write gate signal WT to control the external access. More specifically the column control circuit 90 sets the signal levels of the read gate signal RD and the write gate signal WT to control selection of bit line pairs by the column decoder 26 and operations of the read amplifier 28*a* or the write driver 28*b*. The column control circuit 90 works, in response to the column enable signal #CE given by the column control circuit 80, the write enable signal #WE, the upper byte enable signal #LB, and the upper byte enable signal #UB.

B2. Row Control Circuit

Figure 5:
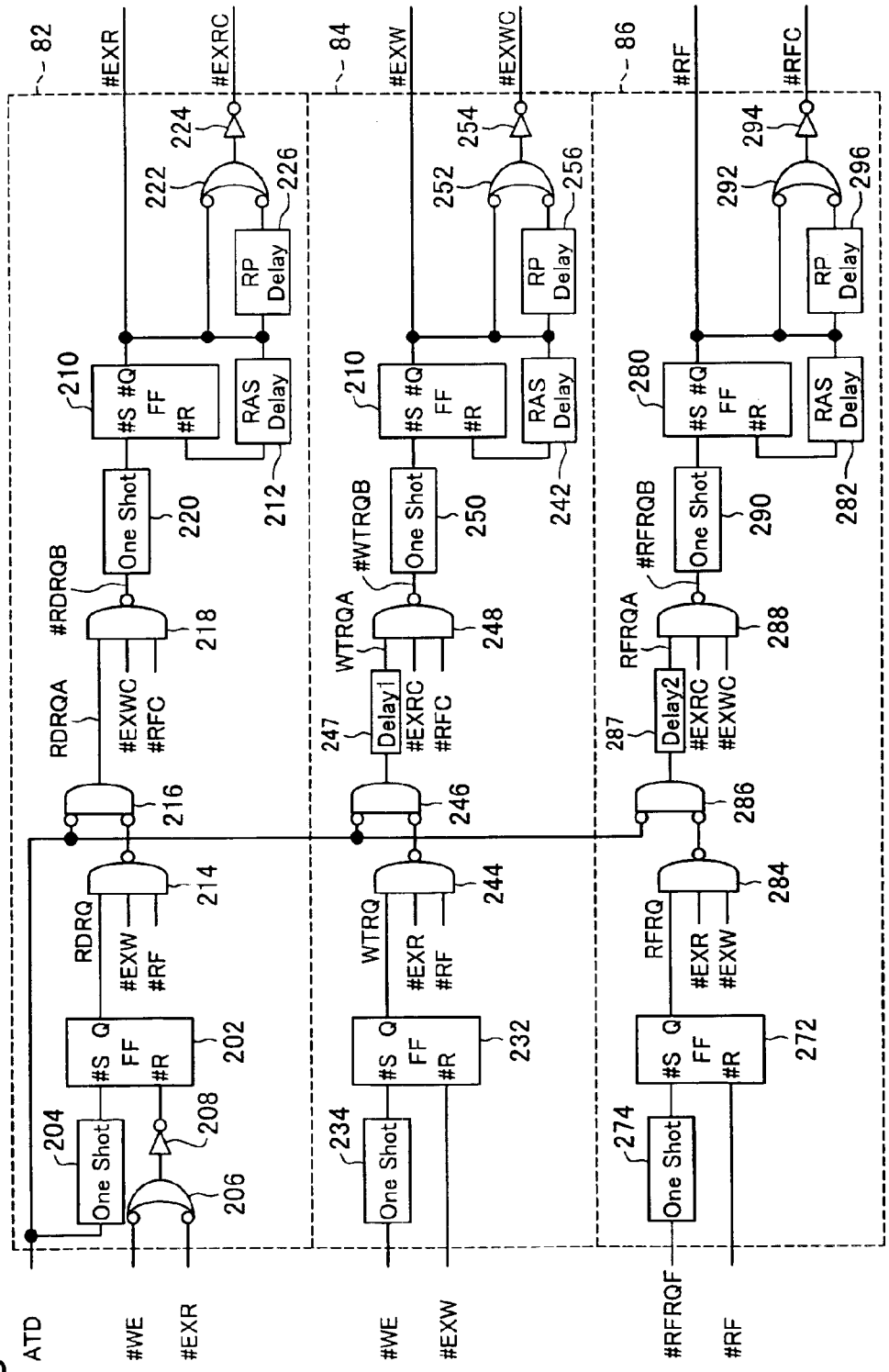
FIG. 5 shows the internal structure of a row control circuit, which includes a read execution signal generator, a write execution signal generator, and a refresh execution signal generator.

FIG. 5 shows the internal structure of the row control circuit 80, which includes a read execution signal generator 82, a write execution signal generator 84, and a refresh execution signal generator. 86. The description sequentially regards the internal structures of the read execution signal generator 82, the write execution signal generator 84, and the refresh execution signal generator 86 and the operations of the respective generators 82, 84, and 86 based on a timing chart.

B.2.1 Read Execution Signal Generator

The read execution signal generator 82 has an inverting-input-type RS flip flop (hereafter simply referred to as 'FF') 202, a one-shot circuit 204 (One Shot), an inverting-input-type OR gate 206, and an inverter 208. The output of the one shot circuit 204 is input into a set terminal (#S) of the FF 202, and the output of the OR gate 206 is input into a reset terminal (#R) of the FF 202 via the inverter 208. The one shot circuit 204 outputs a short pulse signal, which changes to the level L immediately after detection of a falling edge of the ATD signal, as a set signal of the FF 202. The OR gate 206 receives input of the write enable signal #WE and the read execution signal #EXR. The OR gate 206 and the inverter 208 output a signal, which changes to the level L in response to the level L (active state) of the write enable signal #WE or the read execution signal #EXR, as a reset signal of the FF 202. An output Q202 of the FF 202 is thus set to the level H immediately after a change of the ATD signal to the level L, while being reset to the level L immediately after a change of the write enable signal #WE or the read execution signal #EXR to the level L (active). The output Q202 of the FF 202 is used as a 'read request signal RDRQ'.

The read execution signal generator 82 also includes an inverting-input, inverting-output-type FF 210, a delay circuit 212 (RAS Delay), two 3-input NAND gates 214 and 218, an inverting-input-type, 2-input AND gate 216, and a one shot circuit 220. The first NAND gate 214 receives input of the read request signal RDRQ, the write execution signal #EXW, and the refresh execution signal #RF. The AND gate 216 receives the ATD signal and an output signal of the first NAND gate 214. The first NAND gate 214 and the AND gate 216 output a signal RDRQA corresponding to the level of the read request signal RDRQ, only when the write execution signal #EXW and the refresh execution signal #RF are at the level H (inactive) not to execute any write access or refresh operation and when the ATD signal is at the level L. This output signal RDRQA is hereafter referred to as the 'mask read request signal RDRQA'.

The second NAND gate 218 receives input of the mask read request signal RDRQA, a delay write execution signal #EXWC, and a delay refresh execution signal #RFC. The second NAND gate 218 outputs a signal #RDRQB corresponding to the level of the mask read request signal RDRQA, only when the delay write execution signal #EXWC and the delay refresh execution signal #RFC are at the level H (inactive). The delay write execution signal #EXWC has a longer active time (level-L time) by a time period required for pre-charge of a word line, compared with the active time (level-L time) of the write execution signal #EXW. Similarly the delay refresh execution signal #RFC has a longer active time (level-L time) by the time period required for pre-charge of a word line, compared with the active time (level-L time) of the refresh execution signal #RF. Namely the second NAND gate 218 outputs the signal #RDRQB, which changes to the active level at a timing delayed by the time period required for pre-charge of a word line, compared with the timing of change of the mask read request signal RDRQA to the active level (level H). This output signal #RDRQB is hereafter referred to as the 'delay read request signal #RDRQB'.

The one shot circuit 220 outputs a pulse signal, which changes to the level L immediately after detection of a falling edge of the delay read request signal #RDRQB, as a set signal of the FF 210. An output #Q210 of the FF 210 is set to the level L (active) immediately after a change of the delay read request signal #RDRQB to the level L (active). The output #Q210 of the FF 210 is input as a reset signal of the FF 210 via the delay circuit 212 into the FF 210. The output #Q210 of the FF 210 is thus kept at the level L (active) for a time period corresponding to a delay in the delay circuit 212 and is immediately reset to the level H (inactive). The output #Q210 of the FF 210 is used as the read execution signal #EXR. The delay in the delay circuit 212 is set to make the active time (level-L time) of the read execution signal #EXR sufficient for activation of a word line and execution of a read access.

The read execution signal generator 82 further includes an inverting-input-type OR gate 222, an inverter 224, and a delay circuit 226 (RP Delay). The OR gate 222 receives the read execution signal #EXR and a delayed signal of the read execution signal #EXR by the delay circuit 226. The timing of a change of the output of the inverter 224 from the level L to the level H is delayed by a time period corresponding to a delay in the delay circuit 226, compared with the timing of a change of the read execution signal #EXR from the level L to the level H. The output signal of the inverter 224 is used as a delay read execution signal #EXRC. The delay in the delay circuit 226 is set to make the active time (level-L time) of the delay read execution signal #EXRC longer than the active time (level-L time) of the read execution signal #EXR by the time period required for pre-charge of a word line.

B.2.2 Write Execution Signal Generator

The write execution signal generator 84 has an inverting-input-type FF 232 and a one shot circuit 234. The output of the one shot circuit 234 is input into a set terminal (#S) of the FF 232. The one shot circuit 234 outputs a pulse signal, which changes to the level L immediately after detection of a falling edge of the write enable signal #WE, as a set signal of the FF 232. An output Q232 of the FF 232 is thus set to the level H immediately after a change of the write enable signal #WE to the level L. The write execution signal #EXW is input into a reset terminal (#R) of the FF 232, which is reset to the level L immediately after a change of the write execution signal #EXW to the level L (active). The output Q232 of the FF 232 is used as a 'write request signal WTRQ'.

The write execution signal generator 84 also includes an inverting-input, inverting-output-type FF 240, a delay circuit 242 (RAS Delay), two 3-input NAND gates 244 and 248, an inverting-input-type, 2-input AND gate 246, and a one shot circuit 250. The first NAND gate 244 receives input of the write request signal WTRQ, the read execution signal #EXR, and the refresh execution signal #RF. The AND gate 246 receives the ATD signal and an output signal of the first NAND gate 244. The first NAND gate 244 and the AND gate 246 output a signal WTRQA corresponding to the level of the write request signal WTRQ via a delay circuit 247, only when the read execution signal #EXR and the refresh execution signal #RF are at the level H (inactive) not to execute any read access or refresh operation and when the ATD signal is at the level L. The output signal WTRQA of the delay circuit 247 is hereafter referred to as the 'mask write request signal WTRQA'.

The second NAND gate 248 receives input of the mask write request signal WTRQA, the delay read execution signal #EXRC, and the delay refresh execution signal #RFC. The second NAND gate 248 outputs a signal #WTRQB corresponding to the level of the mask write request signal WTRQA, only when the delay read execution signal #EXRC and the delay refresh execution signal #RFC are at the level H (inactive). The delay read execution signal #EXRC has a longer active time (level-L time) by the time period required for pre-charge of a word line, compared with the active time (level-L time) of the read execution signal #EXR. Similarly the delay refresh execution signal #RFC has a longer active time (level-L time) by the time period required for pre-charge of a word line, compared with the active time (level-L time) of the refresh execution signal #RF. Namely the second NAND gate 248 outputs the signal #WTRQB, which changes to the active level at a timing delayed by the time period required for pre-charge of a word line, compared with the timing of change of the mask write request signal WTRQA to the active level (level H). The output signal #WTRQB of the second NAND gate 248 is hereafter referred to as the 'delay write request signal #WTRQB'.

The one shot circuit 250 outputs a pulse signal, which changes to the level L immediately after detection of a falling edge of the delay write request signal #WTRQB, as a set signal of the FF 240. An output #Q240 of the FF 240 is set to the level L (active) immediately after a change of the delay write request signal #WTRQB to the level L (active). The output #Q240 of the FF 240 is input as a reset signal of the FF 240 via the delay circuit 242 into the FF 240. The output #Q240 of the FF 240 is thus kept at the level L (active) for a time period corresponding to a delay in the delay circuit 242 and is immediately reset to the level H (inactive). The output #Q240 of the FF 240 is used as the write execution signal #EXW. The delay in the delay circuit 242 is set to make the active time (level-L time) of the write execution signal #EXW sufficient for activation of a word line and execution of a write access.

The write execution signal generator 84 further has an inverting-input-type OR gate 252, an inverter 254, and a delay circuit 256 (RP Delay). The OR gate 252 receives the write execution signal #EXW and a delayed signal of the write execution signal #EXW by the delay circuit 256. The timing of a change of the output of the inverter 254 from the level L to the level H is delayed by a time period corresponding to a delay in the delay circuit 256, compared with the timing of a change of the write execution signal #EXW from the level L to the level H. The output signal of the inverter 254 is used as the delay write execution signal #EXWC. The delay in the delay circuit 256 is set to make the active time (level-L time) of the delay write execution signal #EXWC longer than the active time (level-L time) of the write execution signal #EXW by the time period required for pre-charge of a word line.

B.2.3 Refresh Execution Signal Generator

The refresh execution signal generator 86 has an inverting-input type FF 272 and a one shot circuit 274. The output of the one shot circuit 274 is input into a set terminal (#S) of the FF 272. The one shot circuit 274 outputs a pulse signal, which changes to the level L immediately after detection of a rising edge of the refresh timing signal RFRQF, as a set signal of the FF 272. An output Q272 of the FF 272 is thus set to the level H immediately after a change of the refresh timing signal RFRQF to the level H. The refresh execution signal #RF is input into a reset terminal (#R) of the FF 272, which is reset to the level L immediately after a change of the refresh execution signal #RF to the level L (active). The output Q272 of the FF 272 is used as a 'refresh request signal RFRQ'.

The refresh execution signal generator 86 also includes an inverting-input, inverting-output-type FF 280, a delay circuit 282 (RAS Delay), two 3-input NAND gates 284 and 288, an inverting-input-type, 2-input AND gate 286, and a one shot circuit 290. The first NAND gate 284 receives input of the refresh request signal RFRQ, the read execution signal #EXR, and the write execution signal #EXW. The AND gate 286 receives the ATD signal and an output signal of the first NAND gate 284. The first NAND gate 284 and the AND gate 286 output a signal RFRQA corresponding to the level of the refresh request signal RFRQ via a delay circuit 287, only when the read execution signal #EXR and the write execution signal #EXW are at the level H (inactive) not to execute any read access or write access and when the ATD signal is at the level L. The output signal RFRQA of the delay circuit 287 is hereafter referred to as the 'mask refresh request signal RFRQA'. The delay in the delay circuit 287 is set to be not smaller than the delay in the delay circuit 247.

The second NAND gate 288 receives input of the mask refresh request signal RFRQA, the delay read execution signal #EXRC, and the delay write execution signal #EXWC. The second NAND gate 288 outputs a signal #RFRQB corresponding to the level of the mask refresh request signal RFRQA, only when the delay read execution signal #EXRC and the delay write execution signal #EXWC are at the level H (inactive). The delay read execution signal #EXRC has a longer active time (level-L time) by the time period required for pre-charge of a word line, compared with the active time (level-L time) of the read execution signal #EXR, as mentioned previously. Similarly the delay write execution signal #EXWC has a longer active time (level-L time) by the time period required for pre-charge of a word line, compared with the active time (level-L time) of the write execution signal #EXW, as mentioned previously. Namely the second NAND gate 288 outputs the signal #RFRQB, which changes to the active level at a timing delayed by the time period required for pre-charge of a word line, compared with the timing of change of the mask refresh request signal RFRQA to the active level (level H). The output signal #RFRQB of the second NAND gate 288 is hereafter referred to as the 'delay refresh request signal #RFRQB'.

The one shot circuit 290 outputs a pulse signal, which changes to the level L immediately after detection of a falling edge of the delay refresh request signal #RFRQB, as a set signal of the FF 280. An output #Q280 of the FF 280 is set to the level L (active) immediately after a change of the delay refresh request signal #RFRQB to the level L (active). The output #Q280 of the FF 280 is input as a reset signal of the FF 280 via the delay circuit 282 into the FF 280. The output #Q280 of the FF 280 is thus kept at the level L (active) for a time period corresponding to a delay in the delay circuit 282 and is immediately reset to the level H (inactive). The output #Q280 of the FF 280 is used as the refresh execution signal #RF. The delay in the delay circuit 282 is set to make the active time (level-L time) of the refresh execution signal #RF sufficient for activation of a word line and execution of a refresh access.

The refresh execution signal generator 86 further has an inverting-input-type OR gate 292, an inverter 294, and a delay circuit 296 (RP Delay). The OR gate 292 receives the refresh execution signal #RF and a delayed signal of the refresh execution signal #RF by the delay circuit 296. The timing of a change of the output of the inverter 294 from the level L to the level H is delayed by a time period corresponding to a delay in the delay circuit 296, compared with the timing of a change of the refresh execution signal #RF from the level L to the level H. The output signal of the inverter 294 is used as the delay refresh execution signal #RFC. The delay in the delay circuit 296 is set to make the active time (level-L time) of the delay refresh execution signal #RFC longer than the active time (level-L time) of the refresh execution signal #RF by the time period required for pre-charge of a word line.

B.2.4. Operations of Respective Generators

Figure 6:
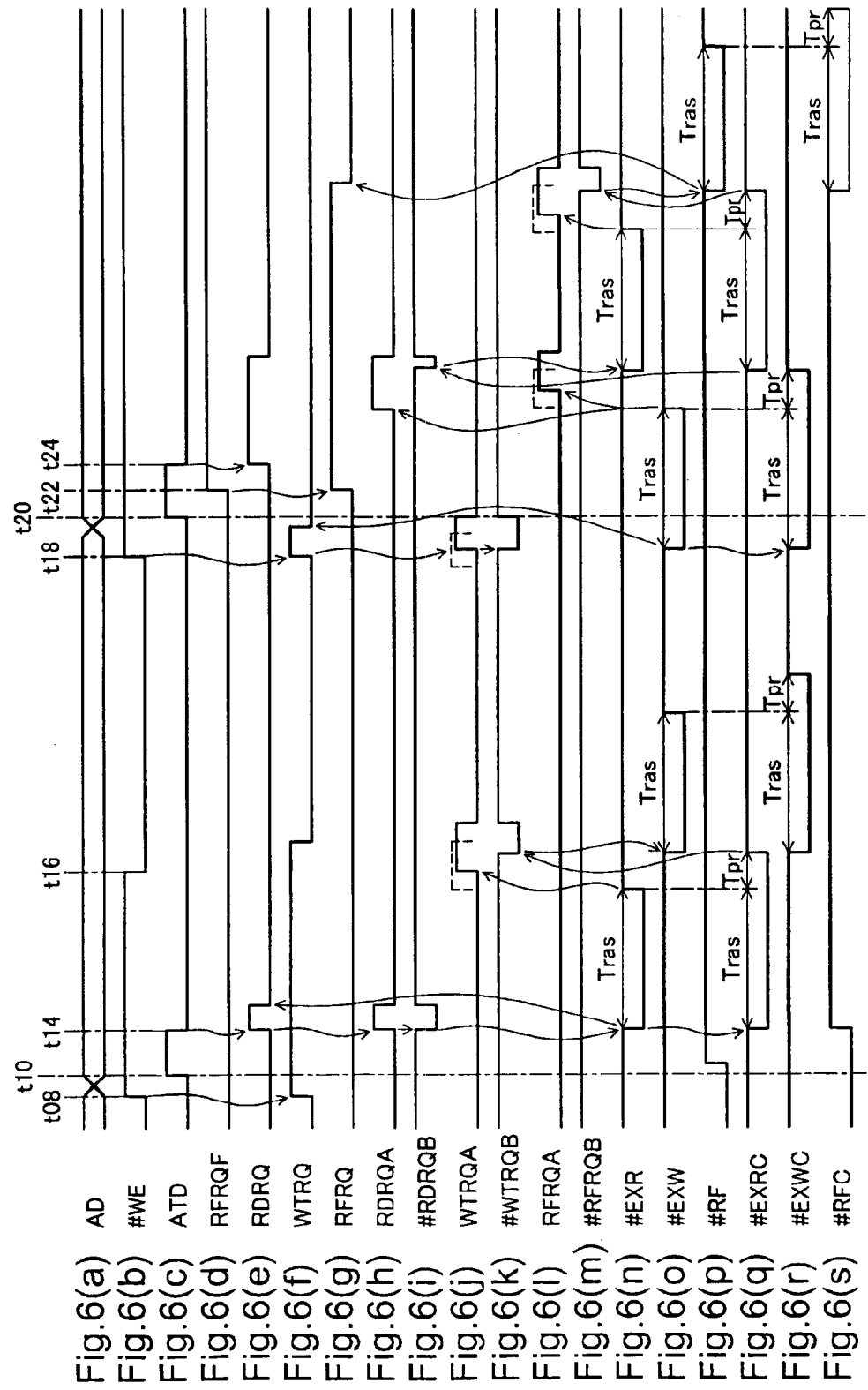
FIGS. 6(a) through 6(s) are a timing chart showing generation timings of a read execution signal #EXR, a write execution signal #EXW, and a refresh execution signal #RF.

FIGS. 6(*a*) through 6(*s*) are a timing chart showing generation timings of the read execution signal #EXR, the write execution signal #EXW, and the refresh execution signal #RF. In the operation mode where the chip select signal #CS (not shown) is at the level L (active), the ATD signal is generated in response to a variation of an externally given address AD. The ATD signal shown in FIG. 6(*c*) is kept at the level H (active) for a time period between a time point t10 and a time point t14 and for a time period between a time point t20 and a time point t24, in response to the variation of the address AD shown in FIG. 6(*a*). The write enable signal #WE shown in FIG. 6(*b*) rises from the level L (active) to the level H (inactive) at a time point t08 prior to the time point t10 and is kept at the level L (active) for a time period between a time point t16 and a time point t18. The refresh timing signal RFRQF shown in FIG. 6(*d*) rises to the level H (active) at a time point t22 during the time period between the time points t20 and t24 when the ATD signal is kept at the level H.

In response to the rise of the write enable signal #WE from the level L (active) to the level H (inactive) at the time point t08 as shown in FIG. 6(*b*), the write request signal WTRQ rises to the level H (active) as shown in FIG. 6(*f*). At this time point, if the read execution signal #EXR and the refresh execution signal #RF are both at the level H (inactive) and the ATD signal is at the level L (inactive), the mask write request signal WTRQA is expected to be varied with a variation of the write request signal WTRQ. If the delay read execution signal #EXRC and the delay refresh execution signal #RFC are both at the level H (inactive), the delay write request signal #WTRQB is expected to be varied with a variation of the mask write request signal WTRQA. The refresh execution signal #RF and the delay refresh execution signal #RFC, however, respectively rise to the level H (inactive) during the time period between the time points t10 and t14 when the ATD signal is at the level H (active), as shown in FIGS. 6(*p*) and 6(*s*). The mask write request signal WTRQA is accordingly kept at the level L (inactive) until a rise to the level H (active) at a specified timing (discussed later), as shown in FIG. 6(*j*). Similarly the delay write request signal #WTRQB is kept at the level H (inactive) until a fall to the level L (active) at a specified timing (discussed later), as shown in FIG. 6(*k*). The write request signal WTRQ is kept at the level H (active) until a fall to the level L (inactive) at a specified timing (discussed later), as shown in FIG. 6(*f*).

In response to a fall of the ATD signal to the level L at the time point t14, the read request signal RDRQ rises to the level H (active), as shown in FIG. 6(*e*). At this time point, the write execution signal #EXW shown in FIG. 6(*o*) and the refresh execution signal #RF shown in FIG. 6(*p*) are at the level H (inactive) and the ATD signal is at the level L. The mask read request signal RDRQA thus rises to the level H (active), in response to the rise of the read request signal RFRQ to the level H, as shown in FIG. 6(*h*). At this time point, the delay write execution signal #EXWC shown in FIG. 6(*r*) and the delay refresh execution signal #RFC shown in FIG. 6(*s*) are also at the level H (inactive). The delay read request signal #RDRQB thus falls to the level L (active), in response to the rise of the mask read request signal RDRQA to the level H (active), as shown in FIG. 6(*i*). The fall of the delay read request signal #RDRQB to the level L (active) causes the read execution signal #EXR to be kept at the level L (active) for a preset time Tras, as shown in FIG. 6(*n*). The delay read execution signal #EXRC is kept at the level L (active) for a longer time period by a preset time Tpr than the read execution signal #EXR, as shown in FIG. 6(*q*). In response to the fall of the read execution signal #EXR to the level L (active), the read request signal RDRQ falls to the level L (inactive).

The mask write request signal WTRQA is going to rise to the level H (active), in response to the fall of the ATD signal at the time point t14. The mask write request signal WTRQA is, however, delayed by the delay circuit 247 (see FIG. 5). Even if the changes of the mask read request signal RDRQA and the mask write request signal WTRQA before the delay are triggered simultaneously by the fall of the ATD signal to the level L, the function of the delay circuit 247 delays the actual change of the mask write request signal WTRQA. Namely the read execution signal #EXR falls to the level L (active), prior to the write execution signal #EXW. The read execution signal #EXR falls to the level L (active) prior to the write execution signal #EXW, while the delay write request signal #WTRQB is kept at the level H (inactive) and the write request signal WTRQ is kept at the level H (active). The fall of the write execution signal #EXW to the level L (active) is thus masked (prohibited).

When the read execution signal #EXR is kept at the level L (active) for the preset time Tras and then rises to the level H (inactive), the mask write request signal WTRQA rises to the level H (active). The delay write request signal #WTRQB falls to the level L (active), in response to a rise of the delay read execution signal #EXRC to the level H (inactive). The fall of the delay write request signal #WTRQB to the level L (active) causes the write execution signal #EXW to be kept at the level L (active) for the preset time Tras, as shown in FIG. 6(o). The delay write execution signal #EXWC is kept at the level L (active) for a longer time period by the preset time Tpr than the write execution signal #EXW, as shown in FIG. 6(r). The write request signal WTRQ falls to the level L (inactive), in response to the fall of the write execution signal #EXW to the level L (active).

In response to a rise of the write enable signal #WE to the level H (inactive) at a time point t18, the write request signal WTRQ rises again to the level H (active). At this time point, the read execution signal #EXR, the refresh execution signal #RF, the delay read execution signal #EXRC, and the delay refresh execution signal #RFC are all at the level H (inactive) and the ATD signal is at the level L. The mask write request signal WTRQA accordingly rises to the level H (active), in response to the rise of the write request signal WTRQ to the level H (active). The rise of the mask write request signal WTRQA to the level H (active) causes the delay write request signal #WTRQB to fall to the level L (active). In response to the fall of the delay write request signal #WTRQB to the level L (active), both the write execution signal #EXW and the delay write execution signal #EXWC fall to the level L (active). The fall of the write execution signal #EXW to the level L (active) causes the write request signal WTRQ to fall to the level L (inactive).

In response to a rise of the refresh timing signal RFRQF to the level H (active) at a time point t22, the refresh request signal RFRQ rises to the level H (active), as shown in FIG. 6(g). At this time point, if the read execution signal #EXR and the write execution signal #EXW are both at the level H (inactive) and the ATD signal is at the level L (inactive), the mask refresh request signal RFRQA is expected to be varied with a variation of the refresh request signal RFRQ. If the delay read execution signal #EXRC and the delay write execution signal #EXWC are both at the level H (inactive), the delay refresh request signal #RFRQB is expected to be varied with a variation of the mask refresh request signal RFRQA. The refresh request signal RFRQ, however, rises to the level H (active) during the time period between the time points t20 and t24 when the ATD signal is at the level H (active), as shown in FIG. 6(g). The write execution signal #EXW and the delay write execution signal #EXWC are at the level L (active) during this time period. The mask refresh request signal RFRQA is accordingly kept at the level L (inactive) until a rise to the level H (active) at a specified timing (discussed later), as shown in FIG. 6(l). Similarly the delay refresh request signal #RFRQB is kept at the level H (inactive) until a fall to the level L (active) at a specified timing (discussed later), as shown in FIG. 6(m). The refresh request signal RFRQ is kept at the level H (active) until a fall to the level L (inactive) at a specified timing (discussed later), as shown in FIG. 6(g).

In response to a fall of the ATD signal to the level L at a time point t24, the read request signal RDRQ rises to the level H (active). Since the write execution signal #EXW is at the level L (active) at this time point, the mask read request signal RDRQA is kept at the level L (inactive) until a rise of the write execution signal #EXW to the level H (active). Similarly the delay read request signal #RDRQB is kept at the level H (inactive) until a rise of the delay write execution signal #EXWC to the level H (inactive). The read request signal RDRQ is also kept at the level H (active).

When the write execution signal #EXW is kept at the level L (active) for the preset time Tras and then rises to the level H (inactive), the mask read request signal RDRQA rises to the level H (active). The delay read request signal #RDRQB falls to the level L (active), in response to a rise of the delay write execution signal #EXWC to the level H (inactive). The fall of the delay read request signal #RDRQB to the level L (active) causes the read execution signal #EXR to be kept at the level L (active) for the preset time Tras, as shown in FIG. 6(n). The delay read execution signal #EXRC is kept at the level L (active) for a longer time period by the preset time Tpr than the read execution signal #EXR, as shown in FIG. 6(q). The read request signal RDRQ falls to the level L (inactive), in response to the fall of the read execution signal #EXW to the level L (active).

In response to a rise of the write execution signal #EXW to the level H (inactive), the mask refresh request signal RFRQA is going to rise to the level H (active). The mask refresh request signal RFRQA is, however, delayed by the delay circuit 287 (see FIG. 5). Even if the changes of the mask read request signal RDRQA and the mask refresh request signal RFRQA before the delay are triggered simultaneously by the rise of the write execution signal #EXW to the level H, the function of the delay circuit 287 delays the actual change of the mask refresh request signal RFRQA. Namely the read execution signal #EXR falls to the level L (active), prior to the refresh execution signal #RF. The read execution signal #EXR falls to the level L (active) prior to the refresh execution signal #RF, while the delay refresh request signal #RFRQB is kept at the level H (inactive) and the refresh request signal RFRQ is kept at the level H (active).

In response to a rise of the read execution signal #EXR to the level H (inactive), the mask refresh request signal RFRQA rises to the level H (active). In response to a rise of the delay read execution signal #EXRC to the level H (inactive), the delay refresh request signal #RFRQB falls to the level L (active). The fall of the delay refresh request signal #RFRQB to the level L (active) causes the refresh execution signal #RF to be kept at the level L (active) for the preset time Tras, as shown in FIG. 6(p). The delay refresh execution signal #RFC is kept at the level L (active) for a longer time period by the preset time Tpr than the refresh execution signal #RF, as shown in FIG. 6(s). The refresh request signal RFRQ falls to the level L (inactive), in response to the fall of the refresh execution signal #RF to the level L (active).

As discussed above, the read execution signal generator 82, the write execution signal generator 84, and the refresh execution signal generator 86 respectively generate the read execution signal #EXR, the write execution signal #EXW, and the refresh execution signal #RF.

B3. Address Buffer and Data Input Buffer

When the read execution signal #EXR falls to the level L (active) prior to the write execution signal #EXR and the refresh execution signal #RF to preferentially execute a read access, it is required to store an address and data for a write access (hereafter may be referred to as 'writing address' and 'writing data') until execution of the write access. The address buffer 30 and the data input buffer 44 are thus constructed as discussed below.

B.3.1. Address Buffer

Figure 7:
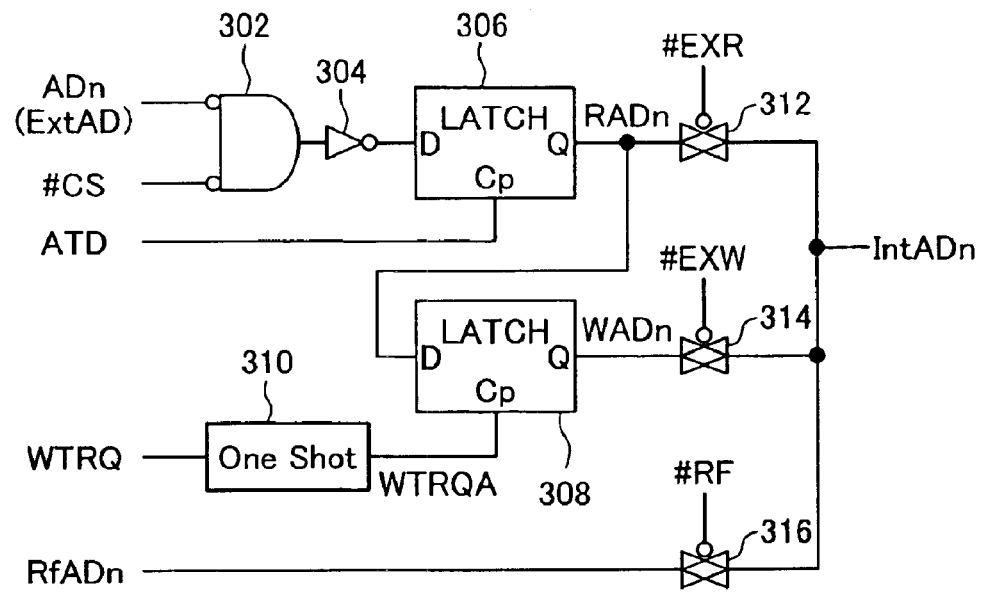
FIG. 7 shows the internal structure of an address buffer

FIG. 7 shows the internal structure of the address buffer 30. More specifically FIG. 7 shows one address buffer block corresponding to one address bit ADn (where n is an integer in the range of 8 to 19) among address bits A8 to A19 in the row address RowAD of the 20-bit address A0 to A19

The address buffer block includes an inverting-input-type AND gate 302, an inverter 304, two latches 306 and 308, one shot circuit 310, and three switches 312, 314, and 316. The AND gate 302 receives input of the address bit ADn and the chip select signal #CS. The AND gate 302 and the inverter 304 control supply or non-supply of the input of the address bit ADn to the first latch 306 according to the level of the chip select signal #CS. When the chip select signal #CS is at the level L (active), the address bit ADn is supplied to the first latch 306. When the chip select signal #CS is at the level H (inactive), on the other hand, supply of the address bit ADn to the first latch 306 is masked.

The first latch 306 latches the value of the input address bit ADn according to the level of the ATD signal. More specifically, the first latch 306 varies its output Q306 with a variation of the input address bit ADn, while the ATD signal is at the level H. When the ATD signal falls to the level L, the first latch 306 latches the value of the address bit ADn at the time of the fall and gives the latched value of the address bit ADn as the output Q306. The output Q306 is used as a read address RADn for a read access. The output Q306 of the first latch 306 is given to the second latch 308.

The one shot circuit 310 generates a short pulse signal WTRQA, which rises to the level H immediately after detection of a rising edge of the write request signal WTRQ. The short pulse signal WTRQA is input into the second latch 308.

The second latch 308 latches the output Q306 of the first latch 306, in response to the short pulse signal WTRQA. More specifically, the second latch 308 latches the output Q306 of the first latch 308 at the time when the short pulse signal WTRQA generated in response to a rise of the write request signal WTRQ to the level H (active) falls to the level L (hereafter referred to as 'at the time close to the rising time of the write request signal WTRQ to the level H') and gives the latched value as an output Q308. The output Q308 is used as a write address WADn for a write access.

The read address RADn is input into the first switch 312, while the write address WADn is input into the second switch 314. The input into the third switch 316 is a refresh address RfADn. The outputs of the three switches 312, 314, and 316 are interconnected to be given as an internal address IntADn. The first through the third switches 312, 314, and 316 are constructed, for example, by transfer gates.

The read execution signal #EXR, the write execution signal #EXW, and the refresh execution signal #RF are respectively input as control signals into the first switch 312, the second switch 314, and the third switch 316. When the read execution signal #EXR falls to the level L (active) to execute a read access, the first switch 312 is turned on to output the read address RADn latched by the first latch 306 as the internal address IntADn. When the write execution signal #EXW falls to the level L (active) to execute a write access, the second switch 314 is turned on to output the write address WADn latched by the second latch 308 as the internal address IntADn. When the refresh execution signal #RF falls to the level L (active) to execute a refresh operation, the third switch 316 is turned on to supply the refresh address READn as the internal address IntADn to the row decoder 24 and the column decoder 26 (see FIG. 4).

The refresh address is not involved in address buffer blocks corresponding to address bits A0 to A7 of the column address ColAD. The third switch 316 is thus omitted from these address buffer blocks.

As described above, the first and the second latches 306 and 308 latch the address bit ADn as the writing address at the time close to the rising time of the write request signal WTRQ to the level H (inactive), and output the latched writing address as the internal address IntADn while the write execution signal #EXW is kept at the level L (active). This enables the writing address to be stored even when a read access or a refresh operation is executed prior to a write access.

The ATD signal, the write request signal WTRQ, the read execution signal #EXR, the write execution signal #EXW, and the refresh execution signal #RF correspond to the address control signals ADCTL shown in FIG. 4.

B.3.2 Data Input Buffer

Figure 8:
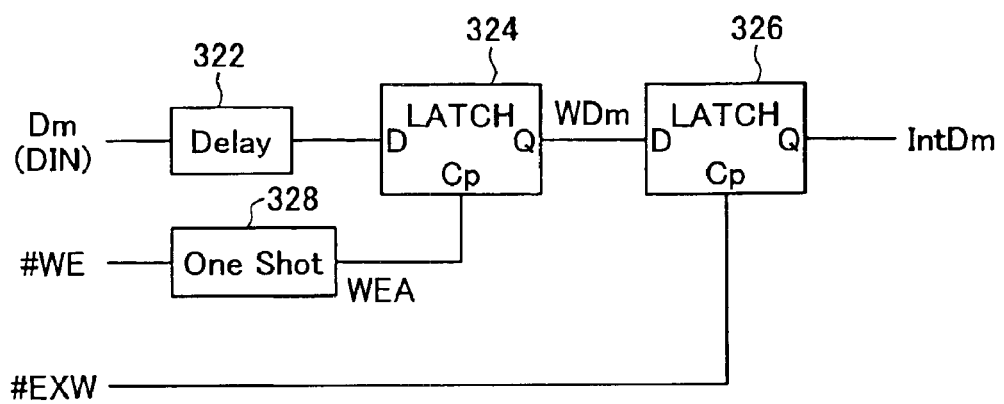
FIG. 8 shows the internal structure of a data input buffer.

FIG. 8 shows the internal structure of the data input buffer 44. More specifically FIG. 8 shows one data input buffer block corresponding to one datum Dm (where m is an integer in the range of 0 to 15) among the 16-bit input data D0 to D15 from the 16-bit input data terminals IO0 to IO15.

The data input buffer block includes a delay circuit 322 (Delay), two latches 324 and 326, and a one shot circuit 328. Input data Dm is input into the first latch 324 via the delay circuit 322. The one shot circuit 328 generates a short pulse signal WEA, which rises to the level H immediately after detection of a rising edge of the write enable signal #WE. The short pulse signal WEA is input into the first latch 324.

The first latch 324 latches the input data Dm in response to the short pulse signal WEA. More specifically, the first latch 324 latches the input data Dm as writing data at the time when the short pulse signal WEA generated in response to a rise of the write enable signal #WE to the level H (inactive) falls to the level L (hereafter referred to as 'at the time point close to the rising time of the write enable signal #WE to the level H') and gives the latched value as an output Q324. This output Q324 is input into the second latch 326.

The second latch 326 latches the output Q324 of the first latch 324 at the time of the fall of the write execution signal #EXW to the level L (active) and gives the latched value as an output Q326. This output Q326 is supplied as write data IntDm for a write access to the write driver 28b (see FIG. 4).

As described above, the first and the second latches 324 and 326 latch the input data Dm as the writing data at the time close to the rising time of the write enable signal #WE to the level H (inactive), keep the latched writing data while the write execution signal #WEX is at the level L (active), and supply the latched writing data to the write driver 28b. This enables the writing data to be stored even when a read access is executed prior to a write access.

C. Operations in Operation Mode

The following describes the operations in the operation mode as a general read access, a general write access, and a special write access. Although not being specifically mentioned, a refresh operation is executed at every generation cycle of the refresh timing signal RFRQF in the standby mode.

C1. Read Access

Figure 9:
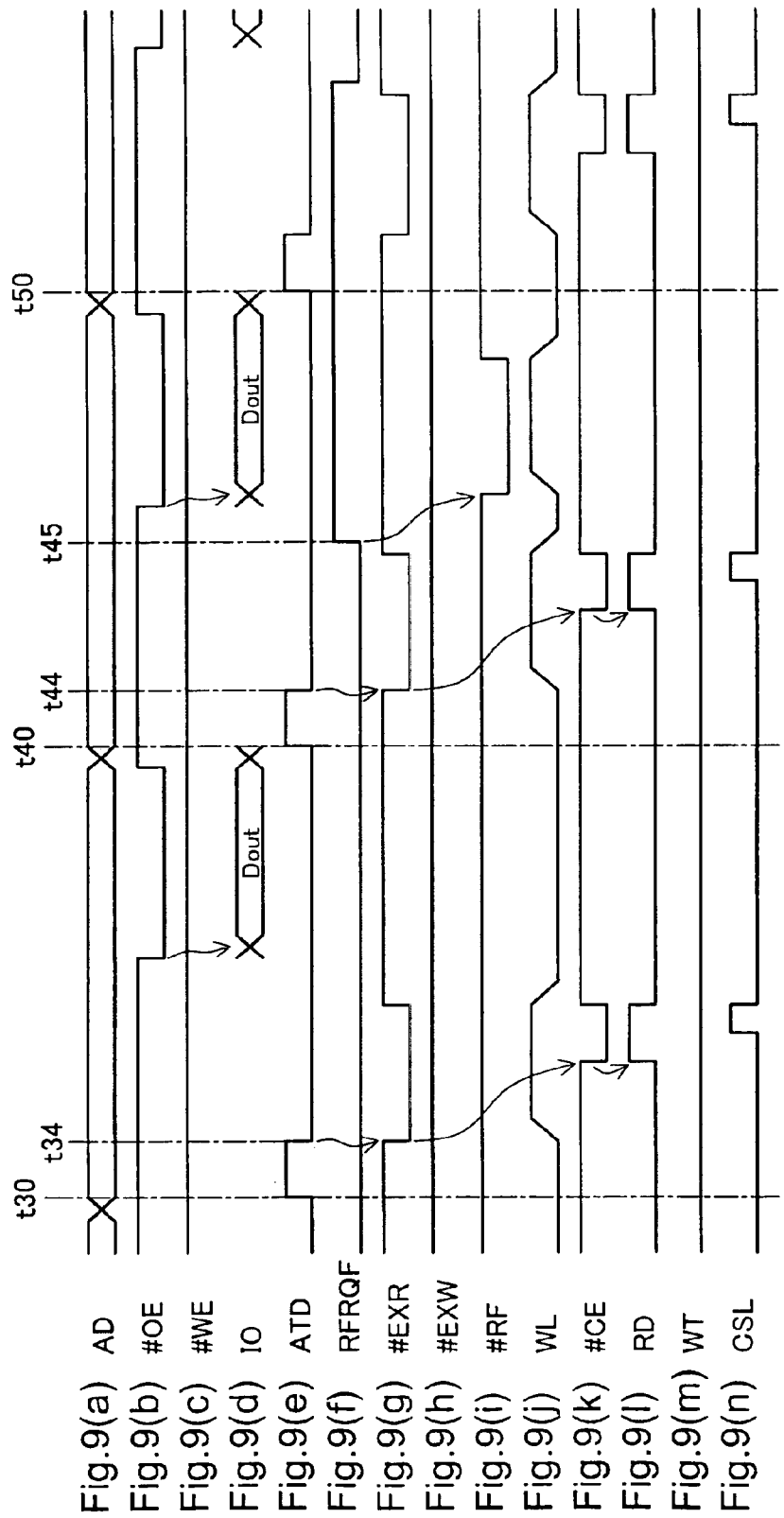
FIGS. 9(a) through 9(n) are a timing chart in a read access.

FIGS. 9(a) through 9(n) are a timing chart in a read access. The ATD signal shown in FIG. 9(e) rises to the level H at time points t30, t40, and t50, in response to a variation of the address AD shown in FIG. 9(a). Operation cycles run respectively in a time period between the time points t30 and t40 and in a time period between the time points t40 and t50. In each of the operation cycles, the write enable signal #WE is kept at the level H as shown in FIG. 9(c) and a read access is carried out. In the first cycle of the time point t30 to the time point t40, only a read access is carried out. In the second cycle of the time point t40 to the time point t50, the refresh timing signal RFRQF rises to the level H (active) at a time point t45 to give a refresh request, so that a refresh operation, as well as a read access is carried out.

In the first operation cycle of the time point t30 to the time point t40, the read execution signal #EXR (FIG. 9(g)) is kept at the level L (active) for a preset time, in response to a fall of the ATD signal to the level L at a time point t34. The fall of the read execution signal #EXR to the level L (active) activates a word line WL corresponding to the input row address as shown in FIG. 9(j). The fall of the read execution signal #EXR also makes the column enable signal #CE fall to the level L (active) as shown in FIG. 9(k) and the read gate signal RD rise to the level H (active) as shown in FIG. 9(l). Data are then read from selected bit line pairs CSL corresponding to the input column address as shown in FIG. 9(n). The data are latched in response to a latch signal (not shown). The latched data are output as reading data DOUT from the input-output data terminals IO0 (=IO0 to IO15) as shown in FIG. 9(d), while the output enable signal #OE is kept at the level L (active) as shown in FIG. 9(b). As a matter of convenience, the signal waveform of FIG. 9(j) shows the waveforms of multiple word lines as if the waveform of one word line. Similarly the signal waveform of FIG. 9(n) shows the waveforms of multiple bit line pairs as if the waveform of one bit line pair. This is applied to other timing charts discussed later.

As in the first operation cycle, in the second operation cycle of the time point t40 to the time point t50, in response to a fall of the ATD signal to the level L at a time point t44, the read execution signal #EXR falls to the level L to execute a read access. A rise of the read execution signal #EXR to the level H (inactive) concludes an actual reading operation from selected memory cells and the selected word line is inactivated. In response to a rise of the refresh timing signal RFRQF to the level H (active) at a time point t45 as shown in FIG. 9(f) after the rise of the read execution signal #EXR to the level H (inactive), even while the output enable signal #OE is at the level L (active) to output the reading data, the refresh execution signal #RF falls to the level L (active) as shown in FIG. 9(i) to activate a selected word line WL and execute a refresh operation.

As described above, in the memory chip 100 of the embodiment, the read execution signal #EXR is kept at the level L (active) for a preset time to execute a reading operation in one read cycle. A refresh operation is thus executable between a rise of the read execution signal #EXR to the level H (inactive) and start of a next cycle. The refresh operation may thus be executed, independently of the ATD signal. This desirably eliminates the long rate restriction in the reading operation.

C2. Early Write Access

Figure 10:
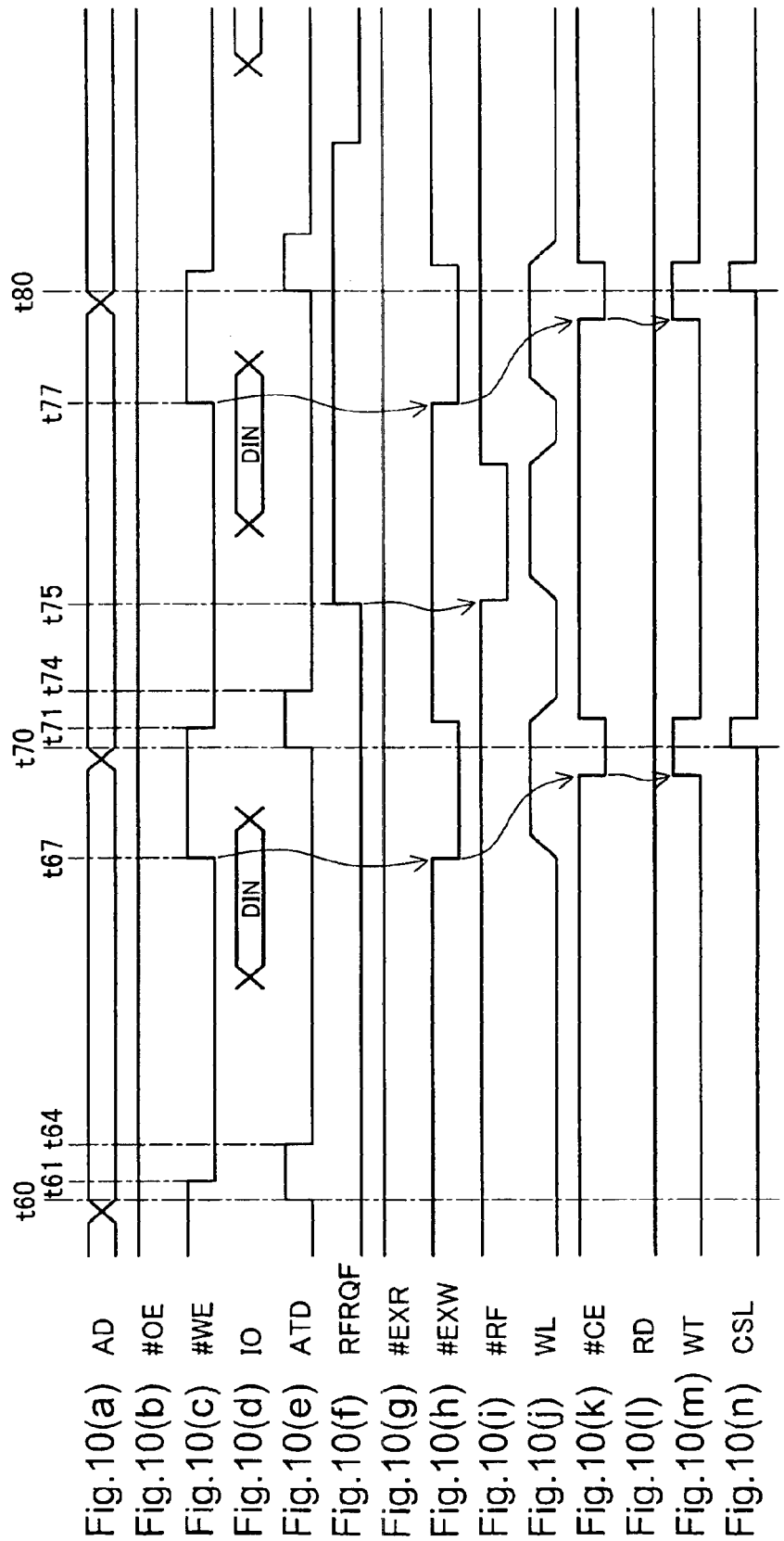
FIGS. 10(a) through 10(n) are a timing chart in an early write access.

FIG. 10 s a timing chart in a general write access (early write access). The ATD signal shown in FIG. 10(e) rises to the level H at time points t60, t70, and t80, in response to a variation of the address AD shown in FIG. 10(a). Operation cycles run respectively in a time period between the time points t60 and t70 and in a time period between the time points t70 and t80. In the first cycle of the time point t60 to the time point t70, as shown in FIG. 10(c), the write enable signal #WE falls to the level L (active) at a time point t61, which comes before a time point t64 when the ATD signal falls to the level L. The read execution signal #EXR, however, does not fall to the level L (active) as shown in FIG. 10(g). An early write access is accordingly executed in the first cycle. In the second cycle of the time point t70 to the time point t80, the write enable signal #WE falls to the level L (active) at a time point t71, which comes before a time point t74 when the ATD signal falls to the level L, so that an early write access is executed.

In the first cycle of the time point t60 to the time point t70, in response to a rise of the write enable signal #WE to the level H (inactive) at a time point t67, the write execution signal #EXW falls to and keeps the level L (active) for a preset time period as shown in FIG. 10(h). The fall of the write execution signal #EXW to the level L (active) activates a word line WL corresponding to the input row address as shown in FIG. 10(j). The fall of the write execution signal #EXW also makes the column enable signal #CE fall to the level L (active) as shown in FIG. 10(k) and the write gate signal WT rise to the level H (active) as shown in FIG. 10(m). Data DIN input from the input-output data terminals IO (=IO0 to IO15) are then written into selected memory cells on selected bit line pairs CSL corresponding to the input column address as shown in FIG. 10(n).

As in the first cycle, in the second cycle of the time point t70 to the time point t80, in response to a rise of the write enable signal #WE to the level H (inactive) at a time point t77, the write execution signal #EXW falls to and keeps the level L (active) for the preset time period. The fall of the write execution signal #EXW to the level L (active) activates a word line WL corresponding to the input row address. The fall of the write execution signal #EXW also makes the column enable signal #CE fall to the level L (active) and the write gate signal WT rise to the level H (active). Data DIN input from the input-output data terminals IO (=IO0 to IO15) are then written into selected memory cells on selected bit line pairs CSL corresponding to the input column address.

The actual writing operation is carried out after the rise of the write enable signal #WE to the level H (inactive). No external access is accordingly executed during a time period after the write execution signal #EXW falls to and keeps the level L (active) for the preset time period in response to the rise of the write enable signal #WE at the time point t67 in the first cycle and before the write execution signal falls to the level L (active) in response to the rise of the write enable signal #WE at the time point t77 in the second cycle. In response to a rise of the refresh timing signal RFRQF to the level H (active) at a time point t75 as shown in FIG. 10(f), the refresh execution signal #RF falls to and keeps the level L (active) for a predetermined time period in this time period of no external access as shown in FIG. 10(i). The fall of the refresh execution signal #RF to the level L activates a corresponding word line WL to execute a refresh operation.

As described above, in the memory chip 100 of the embodiment, the actual writing operation is carried out after a rise of the write enable signal #WE to the level H (inactive) in one write cycle. A refresh operation is thus executable while the write enable signal #WE is kept at the level L (active), that is, while the writing operation is carried out in the conventional cycle. This desirably eliminates the long rate restriction in the writing operation.

C3. Delay Write Access

Figure 11:
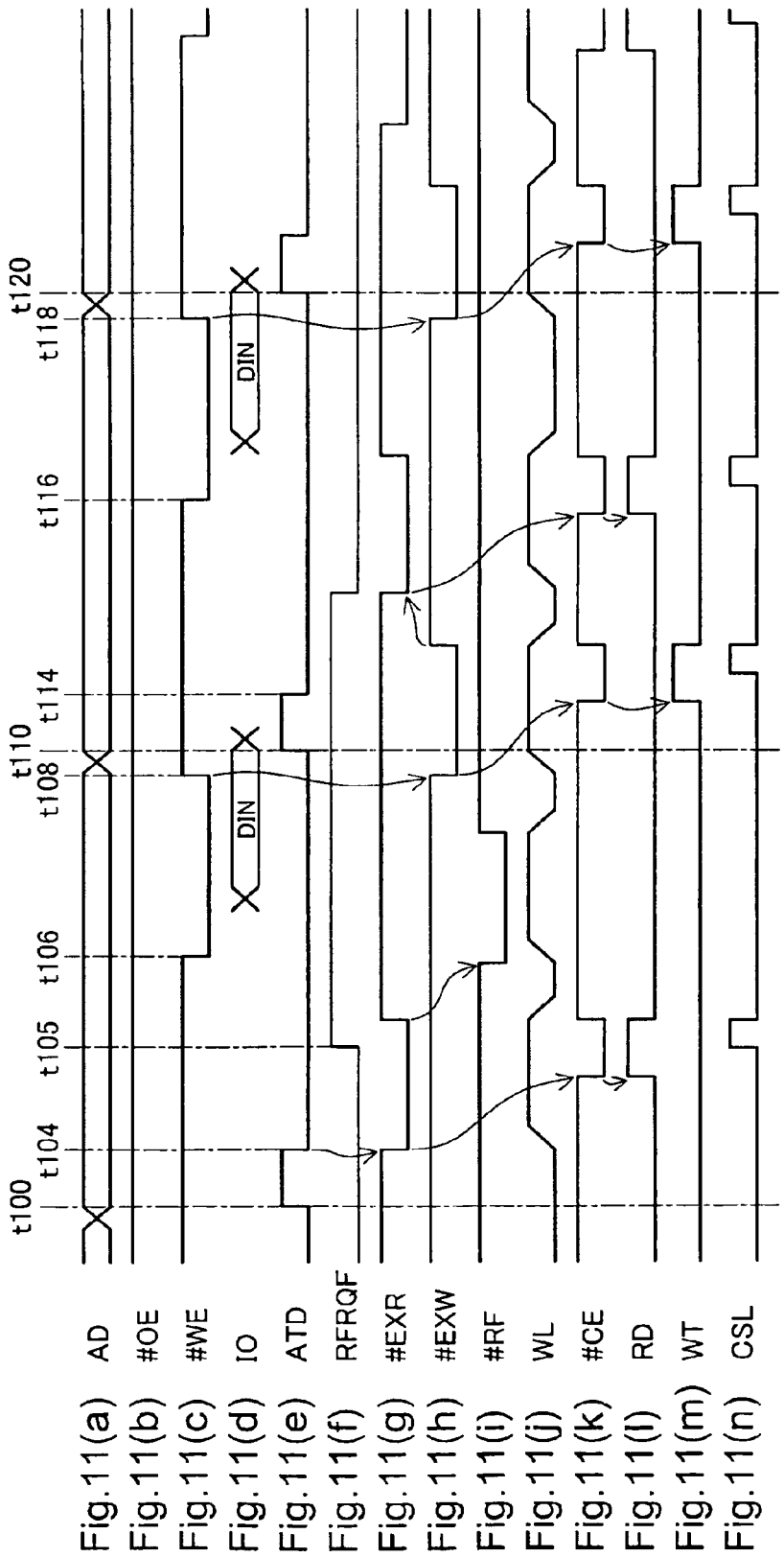
FIGS. 11(a) through 11(n) are a timing chart in a delay write access.

FIG. 11 is a timing chart in a special write access (delay write access). The ATD signal shown in FIG. 11(e) rises to the level H at time points t100, t110, and t120, in response to a variation of the address AD shown in FIG. 11(a). Operation cycles run respectively in a time period between the time points t100 and t110 and in a time period between the time points t110 and t120. In the first cycle of the time point t100 to the time point t110, as shown in FIG. 11(c), the write enable signal #WE falls to the level L (active) at a time point t106, which comes after a time point t104 when the ATD signal falls to the level L. A delay write access is accordingly executed in the first cycle. The delay write access executes a write access after execution of a read access. In the second cycle of the time point t110 to the time point t120, the write enable signal #WE falls to the level L (active) at a time point t116, which comes after a time point t114 when the ATD signal falls to the level L. Similarly a delay write access is executed in the second cycle.

In the first cycle of the time point t100 to the time point t110, in response to the fall of the ATD signal to the level L at the time point t104, the read execution signal #EXR falls to and keeps the level L (active) for a preset time period as shown in FIG. 11(g). The fall of the read execution signal #EXR to the level L (active) activates a word line WL corresponding to the input row address as shown in FIG. 11(j). The fall of the read execution signal #EXR also makes the column enable signal #CE fall to the level L (active) as shown in FIG. 11(k) and the read gate signal RD rise to the level H (active) as shown in FIG. 11(l). Data are then read from selected bit line pairs CSL corresponding to the input column address as shown in FIG. 11(n). Since this cycle is not a read cycle but a write cycle, the output enable signal #OE is continuously kept at the level H (active) as shown in FIG. 11(b). Reading data are thus not output from the input-output data terminals IO (=IO0 to IO15).

In response to a rise of the write enable signal #WE to the level H (inactive) at a time point t108, the write execution signal #EXW falls to and keeps the level L (active) for a preset time period as shown in FIG. 11(h). The fall of the write execution signal #EXW to the level L (active) activates a word line WL corresponding to the input row address. The fall of the write execution signal #EXW also makes the column enable signal #CE fall to the level L (active) and the write gate signal WT rise to the level H (active) as shown in FIG. 11(m). Data DIN input from the input-output data terminals IO (=IO0 to IO15) are then written into selected memory cells on selected bit line pairs CSL corresponding to the input column address.

The refresh timing signal RFRQF rises to the level H (active) at a time point t105 as shown in FIG. 11(f) and accordingly makes the read execution signal #EXR rise to the level H (inactive). The refresh execution signal #RF thus falls to the level L (active) after elapse of a time period required for pre-charge of a word line as shown in FIG. 11(i) to activate a corresponding word line WL and execute a refresh operation.

As in the first cycle, in the second cycle of the time point t110 to the time point t120, in response to a rise of the write enable signal #WE to the level H (inactive) at a time point t118, the write execution signal #EXW falls to and keeps the level L (active) for the preset time period. The fall of the write execution signal #EXW to the level L (active) activates a word line WL corresponding to the input row address. The fall of the write execution signal #EXW also makes the column enable signal #CE fall to the level L (active) and the write gate signal WT rise to the level H (active). Data DIN input from the input-output data terminals IO (=IO0 to IO15) are then written into selected memory cells on selected bit line pairs CSL corresponding to the input column address.

A fall of the ATD signal to the level L at a time point t114 generally leads to a fall of the read execution signal #EXR to the level L. At this moment, however, the write execution signal #EXW, which fell to the level L (active) in response to the rise of the write enable signal #WE to the level H (inactive) at the time point t108 in the previous cycle, is still kept at the level L. The read execution signal #EXR thus falls to the level L (active) to execute a read access, after the write execution signal #EXW rises to the level H (inactive) and the time period for pre-charge of a word line elapses.

Figure 12:
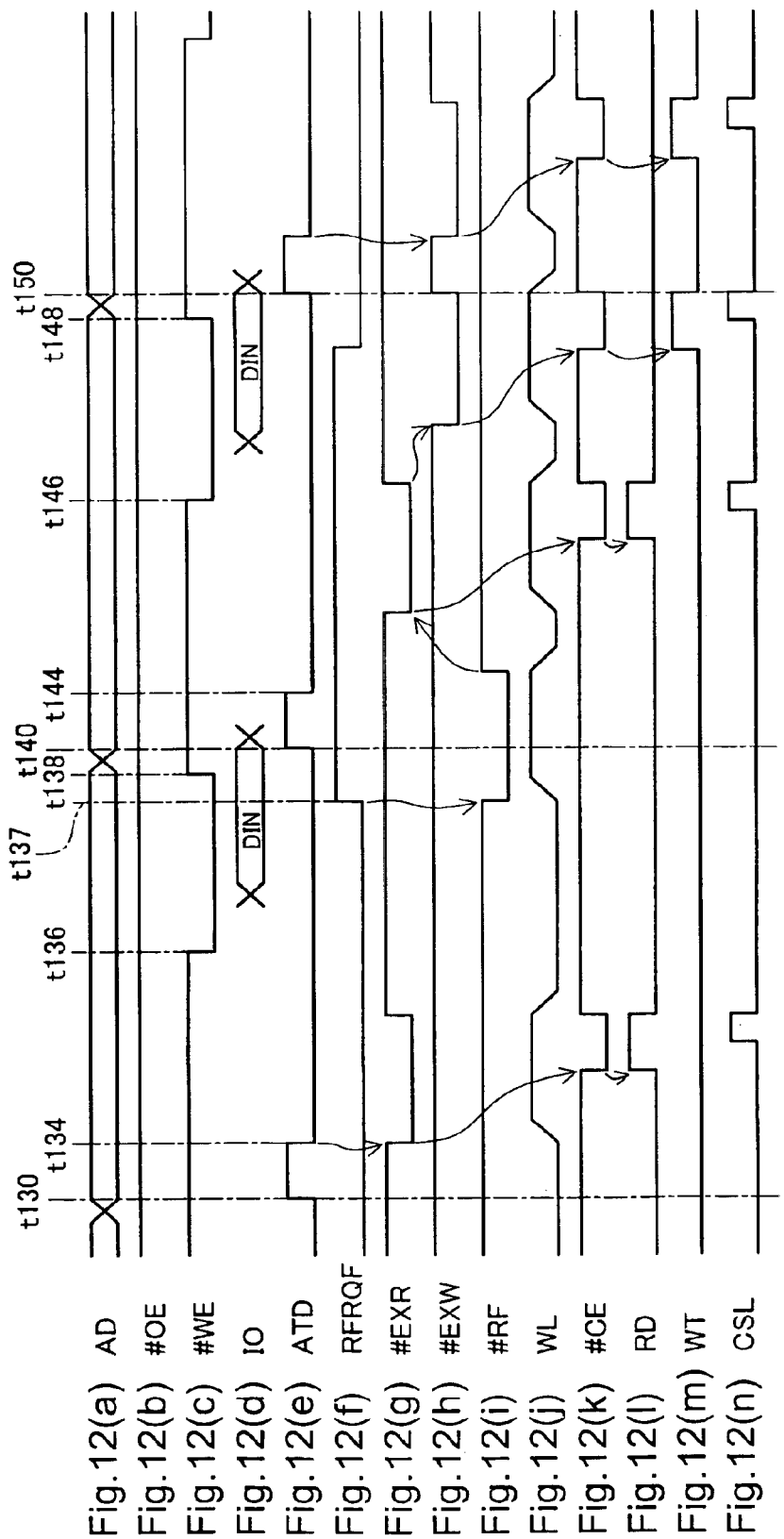
FIGS. 12(a) through 12(n) are another timing chart in the delay write access.

FIG. 12 is another timing chart in the delay write access. In a first cycle of a time point t130 to a time point t140, as shown in FIG. 12(c), the write enable signal #WE falls to the level L (active) at a time point t136, which comes after a time point t134 when the ATD signal shown in FIG. 12(e) falls to the level L. A delay write access is accordingly executed in the first cycle. In a second cycle of a time point t140 to a time point t150, the write enable signal #WE falls to the level L (active) at a time point t146, which comes after a time point t144 when the ATD signal falls to the level L. Similarly a delay write access is executed in the second cycle.

In the first cycle of the time point t130 to the time point t140, in response to the fall of the ATD signal to the level L at the time point t134, the read execution signal #EXR falls to the level L (active) to execute a read access as shown in FIG. 12(g).

A rise of the write enable signal #WE to the level H at a time point t138 generally leads to a fall of the write execution signal #EXW to the level L (active) to execute a write access. In this first cycle, however, the refresh timing signal RFRQF rose to the level H (active) as shown in FIG. 12(f) and the refresh execution signal #RF correspondingly fell to the level L (active) as shown in FIG. 12(i) a little before the time point t138. The write execution signal #EXW is thus kept at the level H (inactive) as shown in FIG. 12(h).

At the time point t144 when the ATD signal falls to the level L, the write enable signal #WE is at the level H. When both the write execution signal #EXW and the refresh execution signal #RF are at the level H (inactive), the read execution signal #EXR immediately falls to the level L (active) to execute a read access. At this moment, however, the refresh execution signal #RF is at the level L (active). The read execution signal #EXR accordingly falls to the level L (active) in preference to the write execution signal #EXW after the refresh execution signal #RF rises to the level H (inactive) and the time period for pre-charge of a word line elapses. The write execution signal #EXW falls to the level L (active) to execute a write access, in response to the rise of the write enable signal #WE to the level H (inactive) at the time point t138 in the previous cycle, after the read execution signal #EXR rises to the level H (inactive) and the time period required for pre-charge of a word line elapses. In response to a subsequent rise of the write enable signal #WE to the level H (inactive) at a time point t148, the write execution signal #EXW falls to the level L (active) to execute a write access.

As described above, in the delay write access, when the write enable signal #WE is at the level H (inactive) at a fall of the ATD signal to the level L, a read access is selected as a next operation in preference to a write access or a refresh operation. The preference of the read access is ascribed to the following reason.

The read access is required to be executed at a high speed. It is accordingly desirable to execute a read access immediately in response to a read access request. The read request signal RDRQ (see FIGS. 5 and 6) is generated when the write enable signal #WE is at the level H (inactive) at a fall of the ATD signal to the level L, as described previously. Generation of the read request signal RDRQ accordingly does not discriminate the read access from the delay write access. Even in the cycle of execution of the delay write access, when the write enable signal #WE is at the level H (inactive) at a fall of the ATD signal to the level L, a read access is selected as a next operation in preference to a write access or a refresh operation, regardless of the earlier generation of a write request or a refresh request.

As described previously with reference to the timing chart of FIG. 6, while the ATD signal is at the level H (active), the rises of the mask read request signal RDRQA, the mask write request signal WTRQA, and the mask refresh request signal RFRQA to the level H (active) are prohibited not to newly start either a write access or a refresh operation.

One available method of giving preference to a read access omits input of the ATD signal into the AND gate 246 of the write execution signal generator 84 and into the AND gate 286 of the refresh execution signal generator 86 shown in FIG. 5. Such omission does not prohibit generation of the mask write request signal WTRQA and generation of the mask refresh request signal RFRQA, while the ATD signal is at the level H (active). One of the operations may thus start during the level-H period (active period) of the ATD signal. On conclusion of the started operation, a read access operation is preferentially executed. The operation starting in the level-H period (active period) of the ATD signal, however, delays the start of the read access. The arrangement of the embodiment, however, prohibits any operation from newly starting in the level-H period (active period) of the ATD signal. This desirably shortens the time elapsing before start of a read access and thereby enhances the access rate in the read access, compared with the arrangement of allowing an operation to newly start in the level-H period (active period) of the ATD signal.

D. Application to Electronic Device

Figure 13:
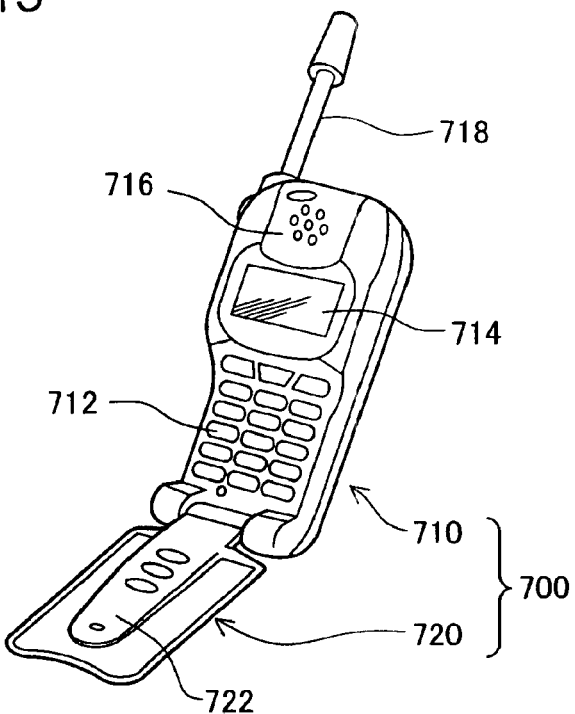
FIG. 13 is a perspective view showing a cell phone as an example of electronic device, to which the semiconductor memory device of the invention is applied.

FIG. 13 is a perspective view showing a cell phone 700 as an example of electronic device, to which the semiconductor memory device of the invention is applied. The cell phone 700 includes a main body 710 and a cover member 720. The main body 710 has a keyboard 712, a liquid crystal display 714, an ear piece 716, and an antenna 718. The cover member 720 has a mouthpiece 722.

Figure 14:
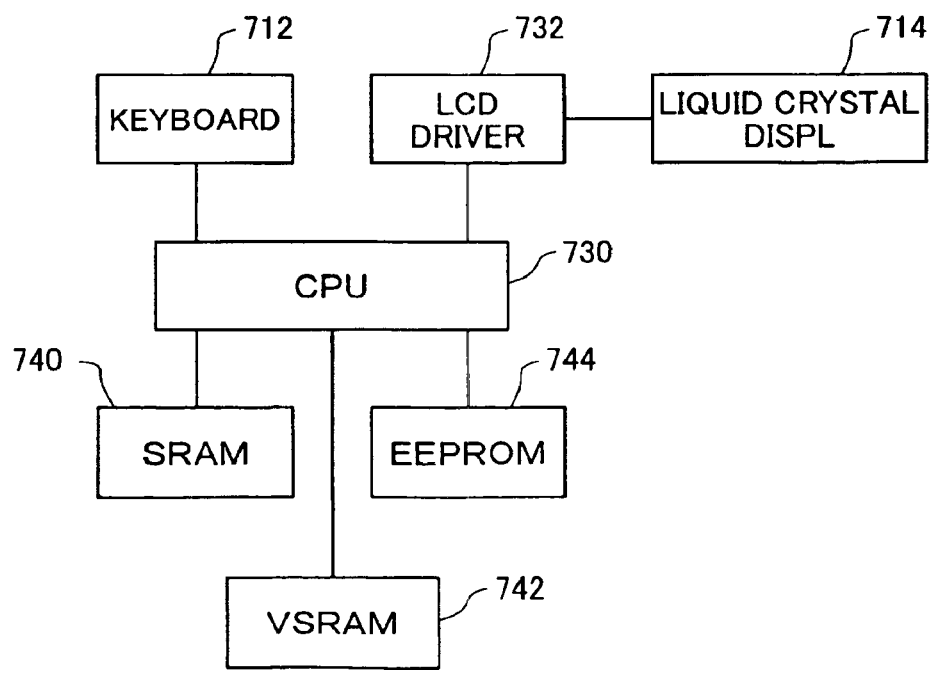
FIG. 14 is a block diagram showing the electric structure of the cell phone shown in FIG. 13.

FIG. 14 is a block diagram showing the electric structure of the cell phone 700. A CPU 730 is connected with the keyboard 712, an LCD driver 732 for driving the liquid crystal display 714, an SRAM 740, a VSRAM 742, and an EEPROM 744.

The SRAM 740 is used, for example, as a high-speed cache memory. The VSRAM 742 is used, for example, as a working memory for image processing. The memory chip 100 of the embodiment discussed above may be applied to this VSRAM 742 (called the pseudo SRAM or the virtual SRAM). The EEPROM 744 is used to store various settings for the cell phone 700.

The VSRAM 742 is kept in the standby state, while the operations of the cell phone 700 temporarily stop. The VSRAM 742 then automatically carries out the internal refresh operation and thereby keeps data stored therein. The memory chip 100 of the embodiment applied to the VSRAM 742 has a relatively large capacity and thus advantageously keeps a mass of data including image data for a long time period. The memory chip 100 automatically carries out the refresh operation and is thus usable like the SRAM.

The embodiment and its application discussed above are to be considered in all aspects as illustrative and not restrictive. There may be many modifications, changes, and alterations without departing from the scope or spirit of the main characteristics of the present invention.

All changes within the meaning and range of equivalency of the claims are intended to be embraced therein. The scope and spirit of the present invention are indicated by the appended claims, rather than by the foregoing description.

What is claimed is:

1. A semiconductor memory device having a memory cell array in which dynamic memory cells are arranged in a matrix, the semiconductor memory device comprising:

an external access timing signal generation module that generates a pulse signal, which changes to an active level in response to a variation of an external address supplied from an external device, as an external access timing signal representing a reference timing of an access operation requested from the external device;

a refresh timer that generates a refresh timing signal representing a reference timing of a refresh operation of the memory cell array; and an access control module that controls execution of a read access, a write access, and a refresh operation of the memory cell array, while a write enable signal supplied from the external device is at an active level representing a data writing request, the access control module prohibiting start of any of a read access operation, a write access operation, and a refresh operation, even in the case of generation of any one of a read access request, a write access request, and a refresh request, even in the case of generation of a write access request or a refresh request in advance, the access control module preferentially executing a read access operation in response to a read access request generated by a change of the external access timing signal to an inactive level while the write enable signal is at an inactive level.

2. The semiconductor memory device in accordance with claim 1, wherein the access control module, in the case of no execution of either a write access operation or a read access operation, triggers execution of a refresh operation for a preset time period in response to a refresh request generated by the refresh timing signal.

3. The semiconductor memory device in accordance with claim 2, wherein the access control module, in the case of execution of any of a read access operation, a write access operation, and a refresh operation at the return timing of the write enable signal to the inactive level, triggers execution of a write access operation for a preset time period after completion of the executed operation.

4. The semiconductor memory device in accordance with claim 3, the semiconductor memory device further comprising:

a storage module that stores the external address and external data according to the return timing of the write enable signal to the inactive level, wherein a write access operation is executed with the external address and the external data stored in the storage module.

5. The semiconductor memory device in accordance with claim 1, wherein the access control module, in the case of execution of any of a read access operation, a write access operation, and a refresh operation at the return timing of the write enable signal to the inactive level, triggers execution of a write access operation for a preset time period after completion of the executed operation.

6. The semiconductor memory device in accordance with claim 5, the semiconductor memory device further comprising:

a storage module that stores the external address and external data according to the return timing of the write enable signal to the inactive level, wherein a write access operation is executed with the external address and the external data stored in the storage module.

7. The semiconductor memory device in accordance with claim 1, the semiconductor memory device further comprising:
- a storage module that stores the external address and external data according to the return timing of the write enable signal to the inactive level,
- wherein a write access operation is executed with the external address and the external data stored in the storage module.

8. An electronic device, comprising a semiconductor memory device in accordance with claim 1.

9. An electronic device, comprising a semiconductor memory device in accordance with claim 2.

10. An electronic device, comprising a semiconductor memory device in accordance with claim 5.

11. An electronic device, comprising a semiconductor memory device in accordance with claim 7.

* * * * *